United States Patent [19]

Dahringer

[11] Patent Number: 5,049,981

[45] Date of Patent: Sep. 17, 1991

[54] HEAT SINK FOR ELECTRONIC CIRCITRY

[75] Inventor: D. W. Dahringer, Glen Ridge, N.J.

[73] Assignee: AT&T Bell Laboratories, Murray Hill, N.J.

[21] Appl. No.: 599,947

[22] Filed: Oct. 19, 1990

[51] Int. Cl.[5] .................... H01L 23/02; H01L 39/02; F28F 7/00; H02G 3/08

[52] U.S. Cl. .................................... 357/81; 357/80; 165/80.2; 174/52.1

[58] Field of Search .................... 357/81, 75, 80; 165/80.2; 174/52.1

[56] References Cited

U.S. PATENT DOCUMENTS 4,408,220  10/1983  Calabro ............................... 357/81

Primary Examiner—Mark Prenty
Attorney, Agent, or Firm—Oleg E. Alber

[57] ABSTRACT

A thermally balanced electronic circuit having an element mounted on a suitable support base, a heat-sink having a bottom portion contacting the element and at least one flange projecting from the bottom portion, and a stress-balancing insert positioned on the bottom portion of the heat-sink and at least partially coextensive with the element, said bottom portion of the heat sink being secured to the element and to the insert by means of an adhesive. The insert is of a material having a coefficient of thermal expansion (TCE), $\alpha_1$, different from the TCE, $\alpha_2$, of material of the heat sink. The TCE of the material of the insert may be intermediate the material of the TCE of the heat sink and the TCE, $\alpha_3$, of the material of the element. Preferably, the TCE of the material of the insert approximately matches or is equal to the TCE of the material of the element. The element, the bottom portion of the heat-sink, the insert and the adhesive layers form a balanced "sandwich" structure. Such a structure will exhibit planar thermal expansion equivalent to the outer skins of the sandwich structure, e.g. of the element and the insert. Expansion of the structure normal to the element and the insert accommodates the balance of the absolute volumetric change of components of the sandwich structure not accounted for in the skins.

19 Claims, 1 Drawing Sheet

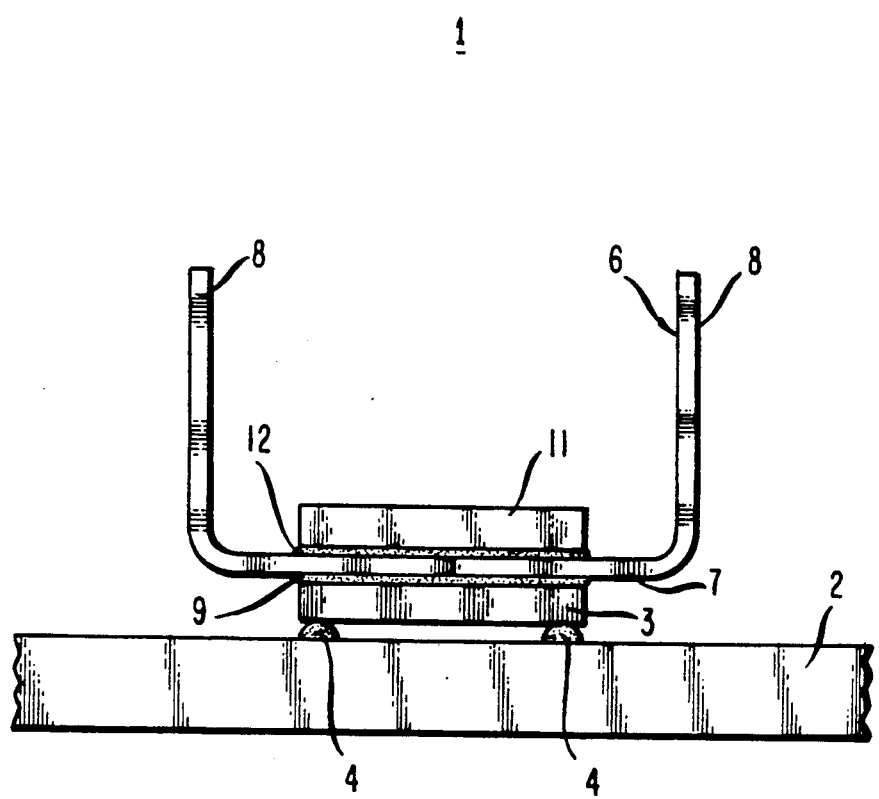

HEAT SINK FOR ELECTRONIC CIRCITRY

TECHNICAL FIELD

This invention relates to heat sinks for the removal of heat from elements of electronic circuits, such as Hybrid Integrated Circuits (HICs).

BACKGROUND OF THE INVENTION

Hybrid Integrated Circuits (HICs) often include active chips, such as Integrated Circuit (IC) chips, or some other electronic and other type of active or passive elements (or devices) which during the operation either generate heat or are subjected to heat generated by other elements of the HIC or the environment. Some of the elements may be susceptible to damage due to this heat, e.g. separation of an element from a support base, fracture of the element, fracture of conductors connecting the element to the support base, changes in operation characteristics, and the like.

To remove the heat from the individual elements of the HIC, at least some of the elements, prone to be affected by the heat, may be selectively provided with a "heat sink" of a high heat conductivity metal to pick up and transfer the heat away from the element.

U.S. Pat. No. 4,408,220 proposes a heat-dissipator (heat-sink) structure including top and bottom plates interconnected by an intermediate section, which structure is formed so as to be slidably mounted on an IC package which is in turn mounted on a support base, such as a printed circuit board. The top plate is resiliently connected and may contact a heat spreader plate which may be common to a number of such heat-sinks. However, with further miniaturization and automation of manufacture and assembly, such a mechanically secured heat-sink may prove difficult to use.

It is, thus, desirable to provide HICs in which a heat-sink is secured to a chip or device so as to form a unitized assembly. It is also important that the structure exhibits a minimum of stress during changes in temperature.

SUMMARY OF THE INVENTION

The present invention is an electronic circuit having an element mounted on a suitable support base, a heat-sink having a bottom portion contacting the element and at least one flange projecting from the bottom portion, and a stress-balancing insert positioned on the bottom portion of the heat-sink and at least partially coextensive with the element, said bottom portion of the heat-sink being secured to the element and to the insert by means of an adhesive. The insert is of a material having a coefficient of thermal expansion (TCE), $\alpha_1$, different from the TCE, $\alpha_2$, of the material of the heat-sink. The TCE of the material of the insert may be intermediate the TCE of the material of the heat sink and the TCE, $\alpha_3$, of the material of the element. Preferably, the TCE of the material of the insert approximately matches the TCE of the material of the element.

The element, the bottom portion of the heat-sink, the insert and the adhesive layers form a balanced "sandwich" structure. Such a structure will exhibit planar thermal expansion equivalent to the outer skins of the sandwich structure, e.g. of the element and the insert. Expansion of the structure normal to the element and the insert accommodates the balance of the absolute volumetric change of components of the sandwich structure not accounted for in the skins.

BRIEF DESCRIPTION OF THE DRAWING

The sole FIGURE is a cross-sectional view showing an exemplary device constructed in accordance with the present invention.

DETAILED DESCRIPTION

Reference numeral 1 designates an exemplary electronic circuit, such as Hybrid Integrated Circuit (HIC) only a portion of which is shown. Reference numeral 2 designates a support base made of a suitable material such as ceramic, simiconductor (e.g. silicon), glass, plastic (e.g. epoxy), glass fiber-reinforces epoxy, resin-coated metal (e.g. epoxy coated aluminum), molded circuit board or other suitable materials. An element, 3, is mounted on the support base in a suitable manner. In an exemplary embodiment, element 3 is an active semiconductor chip, such as an Integrated Circuit (IC) chip. Chip 3 is mounted on the support base in a so-called "flip-chip" manner in conductive contact between circuitry on the chip and conductive leads and pads (not shown) on the support base. The chip is secured to the support base, e.g. at 4, in a conventional manner such as by solder, alloying, gold eutectic bonding, conductive adhesive, non-conductive adhesive and the like.

In an exemplary embodiment, heat-sink 6 is attached to an upper surface of chip 3, that is to that surface of the chip which is opposite to the surface facing the support base. Heat sink, 6, has a bottom portion, 7, contacting the element and at least one flange, 8, projecting from the bottom portion, for conducting the heat away from the element. The heat-sink is of a suitable metal or alloy having high heat conductivity, such as aluminum, copper, nickel, their alloys, brass, bronze, stainless steel. Noble metals or their alloys such as gold, palladium, platimum, silver, can be used. The metal should not lead to contamination of the element. The free end of said at least one flange 8 may freely project from the heat sink. Alternatively, the free end may be provided with a heat-dissipating portion (not shown). Also, the free end may be in contact with a common heat spreader (not shown) which is either provided specifically for dissipating the heat transmitted by each flange or forms a part of a metallic housing about the circuit.

Flange 8 may be a single flange, or it may include at least two flanges. Alternatively, flange 8 may form walls of a cup-shaped heat-sink. Also, the heat sink may contact more than one element and, conveniently, may have more than one flange projecting from the bottom portion.

In the exemplary embodiment, the heat-sink has a U-shaped configuration with bottom portion 7 and flanges 8. The bottom portion is secured to the upper surface of chip 3 by means of an adhesive, 9, having suitable temperature resistance and processing characteristics. Typically, adhesives selected from silicone, polyimide, acrylic, and epoxy resins may be used in HIC devices. An epoxy resin, such as Epon 828 (Shell Chemical Company) cured with 2 ethyl 4 methyl imidazole (Pacific Anchor Corp.) or with other curing agents such as nadicmethyl anhydride (Miller-Stephenson Corp.) is useful. However, conventional attachment of the heat-sink to the element, e.g. a chip, by means of an adhesive, leads to a strained unbalanced structure. This may lead to significant thermally-induced stresses in the chip due to differences in respective coefficients of thermal expansion (TCEs) of the components of the structure. For example a TCE of an epoxy adhesive may vary from 15 to 60 ppm/°C., of a silicone rubber from 150-350 ppm/°C. and polyimide resin from 10 to 20 ppm/°C. while the TCE of a silicon element may be only 2 to 3 ppm/°C. and the metals of the heat-sink may have a TCE within a range of from 1 to 13 ppm/°C.

Stresses caused by differences in TCEs may lead to an improper operation of the device or may render the device inoperable, especially is the stresses result in a fracture of the device (e.g. of a chip) or of conductors connecting the device to a circuitry on the support base or both. Because respective TCEs of adhesive 9, chip 3 and heat-sink 6 differ each from another, this type of a structure could lead to significant thermally induced stresses which may result from subsequent manufacturing steps involving heat, such as a curing step, a soldering step and the like, and/or may arise due to the heat produced by the element itself during the operation of the device, by some other elements located in the vicinity of chip 3 or by an environment. Such stresses may lead to reduced efficiency of operation of the IC chip, damage of the IC chip and interconnections, separation of the chip from the support base and/or the heat/sink and even fracture of the chip.

This problem has been solved by providing a balanced "sandwich"-like structure shown schematically in the FIGURE. Reference 11 denotes a stress-balancing insert, TCE of the material of which, $\alpha_1$, is different from the TCE, $\alpha_2$, of the material of the heat sink. The TCE of the material of the insert, $\alpha_1$, may be intermediate the TCE of the material of the heat sink, $\alpha_2$, and the TCE, $\alpha_3$, of the material of element 3. Preferably, the TCE of the insert is matched to the TCE of the material of element 3, and may be equal to the TCE of the material of the element. The material of the stress-balancing insert comprises a material selected from ceramic, semiconductor, glass and glass fiber reinforced expoxy.

In the exemplary embodiment, the stress-balancing insert is a semiconductor chip, placed within the U-shape of heat-sink 6 in contact with an inside surface of the bottom portion 7 of the heat-sink. Insert 11 is secured to the heat-sink with an adhesive, 12, which is, preferably, of the same type as adhesive 9 which secures heat-sink 6 to active chip 3. Insert 11 may be, for example, an inexpensive "dummy" semiconductor chip, that is one without any dopants and circuitry. The TCE of the material of the dummy chip is selected to closely match that of active chip 3. Insert 11 may also be provided with circuitry on an upper surface thereof for interconnection with some other circuitry or element(s) of the HIC.

Chip 3, bottom portion 7 of the heat sink, insert chip 11 and the two layers of adhesive, 9 and 12, form a TCE balanced "sandwich"-like structure. Such a structure is expected to exhibit planar thermal expansions equivalent to the outer parts (skins) of the sandwich structure. Expansion of the sandwich structure normal to the element and the insert accommodates the balance of the absolute volumetric change of the components of the sandwich structure not accounted for in the outer parts.

It is to be understood that the above-described embodiments are simply illustrative of the principles of the invention. Various other modifications and changes may be devised by those of average skill in the art, which will embody the principles of the invention and fall within the scope and spirit thereof.

What is claimed is:

1. An article comprising an element mounted on a surface of a support base, a heat-sink of a high heat conductivity material having a bottom portion attached to an upper surface of the element and at least one flange projecting from the bottom portion, and a stress-balancing insert positioned on the bottom portion, the bottom portion of the heat-sink being secured to the element and to the insert by means of an adhesive, and the insert being of a material having coefficient of thermal expansion, $\alpha_1$, which is different from the coefficient of thermal expansion of the high heat conductivity material of the heat sink, $\alpha_2$.

2. An article of claim 1 in which the coefficient of thermal expansion of the material of the insert, $\alpha_1$, is intermediate the coefficient of thermal expansion of the high heat conductivity material of the heat sink, $\alpha_2$, and the coefficient of thermal expansion of the material of the element, $\alpha_3$.

3. An article of claim 1 in which the coefficient of thermal expansion of the material of the insert, $\alpha_1$, is matched with the coefficient of thermal expansion of the material of the element, $\alpha_3$.

4. An article of claim 3 in which the coefficient of thermal expansion of the material of the insert, $\alpha_1$, is equal to the coefficient of thermal expansion of the material of the element, $\alpha_3$.

5. An article of claim 1 in which said element is selected from the group consisting of active and passive semiconductor chips, semiconductor devices, capacitors, resistors, oscillators, optical devices and optical fiber interconnections.

6. An article of claim 5 in which the element is a semiconductor chip.

7. An article of claim 1 in which the insert comprises a material selected from the group consisting of ceramic, semiconductor, glass and glass fiber-reinforced epoxy 8. An article of claim 7 in which the material of the insert is a semiconductor.

9. An article of claim 1 in which the insert is in the form of a platelet.

10. An article of claim 1 in which the heat-sink has a U-shaped cross-section.

11. An article of claim 1 in which said heat-sink has a plurality of said flanges.

12. An article of claim 1 in which said heat-sink has a cup-like configuration.

13. An article of claim 1 in which the area of the bottom portion of the heat sink contacting the element is essentially equal to the area of said upper surface of the element.

14. An article of claim 1 in which said high heat conductivity material is a metal.

15. An article of claim 14 in which said heat sink comprises a metal selected from the group consisting of aluminum, copper, nickel and their alloys, brass, bronze, gold, silver, palladium, platinum.

16. An article of claim 1 in which said support base comprises a material selected from the group consisting of ceramic, glass semiconductor, plastic, glass fiber-reinforced resin and resin-coated metal.

17. An article of claim 1 in which said adhesive comprises a resin selected from the group of polymers consisting of silicone, polyimide, epoxy, and acrylic resins.

18. An article of claim 17 in which said adhesive comprises an epoxy resin.

19. An article of claim 1 in which said article forms a part of a Hybrid Integrated Circuit (HIC).

* * * * *